(12) United States Patent
Apel

(10) Patent No.: US 6,441,687 B1
(45) Date of Patent: Aug. 27, 2002

(54) AMPLIFIER BIAS VOLTAGE GENERATING CIRCUIT AND METHOD

(75) Inventor: Thomas R. Apel, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 110 days.

(21) Appl. No.: 09/650,694

(22) Filed: Aug. 29, 2000

(51) Int. Cl.$^7$ .................................. H03F 3/04
(52) U.S. Cl. ...................... 330/296; 323/314; 323/315; 323/316; 330/288; 330/295; 330/296
(58) Field of Search ................... 323/314, 315, 323/316; 330/288, 295

(56) References Cited

U.S. PATENT DOCUMENTS

| | | | | |
|---|---|---|---|---|
| 5,311,148 A | * | 5/1994 | Brannon et al. | ............ 330/288 |
| 6,064,268 A | * | 5/2000 | Felps | ......................... 330/288 |
| 6,194,967 B1 | * | 2/2001 | Johnson et al. | ............. 330/288 |

* cited by examiner

Primary Examiner—Michael B Shingleton
(74) Attorney, Agent, or Firm—Daniel P. Stewart; Skjerven Morrill MacPherson LLP

(57) ABSTRACT

A novel bias voltage generating circuit and method are disclosed. In one embodiment, the bias voltage generating circuit includes a first transistor with a base terminal coupled to the output node and an emitter terminal coupled to ground. The circuit also includes a resistor with a first terminal coupled to a supply voltage node and a second terminal coupled to a collector terminal of the first transistor. A second transistor has an emitter terminal coupled to the collector terminal of the first transistor and a base terminal connected to the collector terminal of the second transistor. A second resistance has a first terminal coupled to the supply voltage node and a second terminal coupled to a collector terminal of the second transistor. A third transistor has a base terminal coupled to the base terminal of the second transistor, a collector terminal coupled to the supply voltage node, and an emitter terminal coupled to the output node. The bias voltage generating circuit utilizes a larger portion of available supply voltage for sensing current than conventional emitter follower bias circuits, and is therefore much less sensitive to supply voltage changes than conventional bias circuits.

12 Claims, 2 Drawing Sheets

US 6,441,687 B1

AMPLIFIER BIAS VOLTAGE GENERATING CIRCUIT AND METHOD

TECHNICAL FIELD OF THE INVENTION

The present invention relates to RF power amplifiers, and in particular to an amplifier bias voltage generating circuit and method.

BACKGROUND OF THE INVENTION

Radiofrequency power amplifiers are often used in portable applications such as cellular telephones. In these applications, operating voltages are limited by available battery voltage. This low voltage operation presents performance challenges to RF power amplifiers.

In power amplifiers, the bias voltage and current provided to the base of the amplifying transistor(s) determine the class of operation and the linearity of the amplifier response. As standard supply voltages are lowered, conventional current mirror reference circuits that have low output impedance are particularly sensitive to any variations in supply voltage, such as a decrease in supply voltage as the battery is discharged. For obvious reasons, this reference current sensitivity to the supply voltage level is undesirable.

SUMMARY OF THE INVENTION

Therefore, a need has arisen for an amplifier biasing scheme that addresses the disadvantages and deficiencies of the prior art. In particular, a need has arisen for a reference current-dependent bias voltage generating circuit with reduced dependence on the voltage supply level.

Accordingly, a novel bias voltage generating circuit is disclosed. In one embodiment, the bias voltage generating circuit includes a first transistor with a base terminal coupled to the output node and an emitter terminal coupled to ground. The circuit also includes a first resistance with a first terminal coupled to a supply voltage node and a second terminal coupled to a collector terminal of the first transistor. A second transistor has an emitter terminal coupled to the collector terminal of the first transistor and a base terminal connected to the collector terminal of the second transistor. A second resistance has a first terminal coupled to the supply voltage node and a second terminal coupled to a collector terminal of the second transistor. A third transistor has a base terminal coupled to the base terminal of the second transistor, a collector terminal coupled to the supply voltage node, and an emitter terminal coupled to the output node.

In accordance with another aspect of the present invention, a method for amplifying an RF input signal is disclosed. In one embodiment, the method includes providing a supply voltage to a first terminal of a first resistor, where the first resistor has a second terminal coupled to a collector terminal of a first transistor. The method also includes providing the supply voltage to a first terminal of a second resistor, where the second resistor has a second terminal connected to a collector terminal of a second transistor. The second transistor has an emitter terminal coupled to the collector terminal of the first transistor, and a base terminal connected to the collector terminal of the second transistor. The method also includes providing the supply voltage to a collector terminal of a third transistor. The third transistor has a base terminal connected to the base terminal of the second transistor, and an emitter terminal coupled to the base terminal of the first transistor. Finally, the method includes generating a bias voltage by the third transistor at the emitter terminal of the third transistor, supplying the bias voltage to a bias node coupled to a base terminal of an amplifying transistor, supplying the RF input signal to an input node coupled to the base terminal of the amplifying transistor, and amplifying the RF input signal by the amplifying transistor.

An advantage of the present invention is that the bias voltage generating circuit described herein utilizes a larger portion of available supply voltage for sensing current than conventional emitter follower bias circuits, and is therefore much less sensitive to supply voltage changes than conventional bias circuits.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

Figure 1:
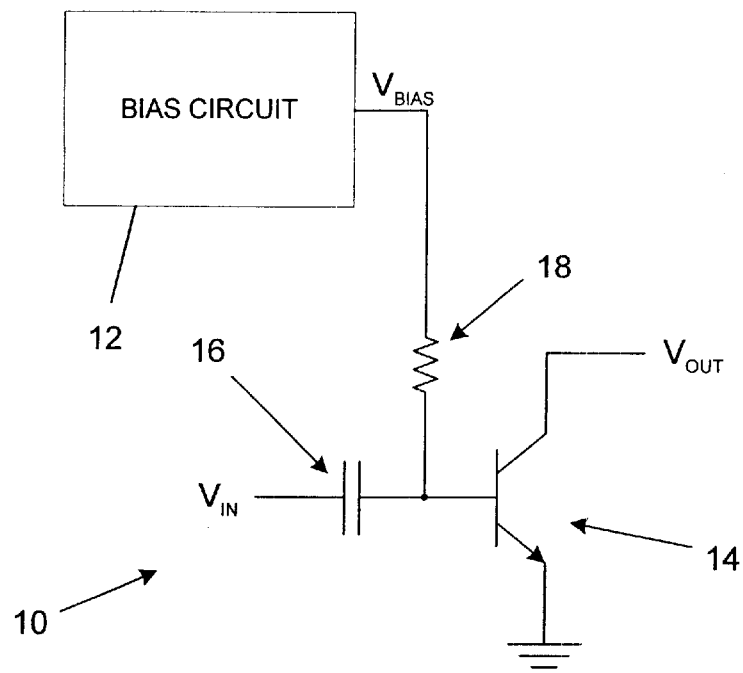
FIG. 1 is a schematic diagram in partial block form of an amplifying circuit designed in accordance with the present invention.
Figure 3:
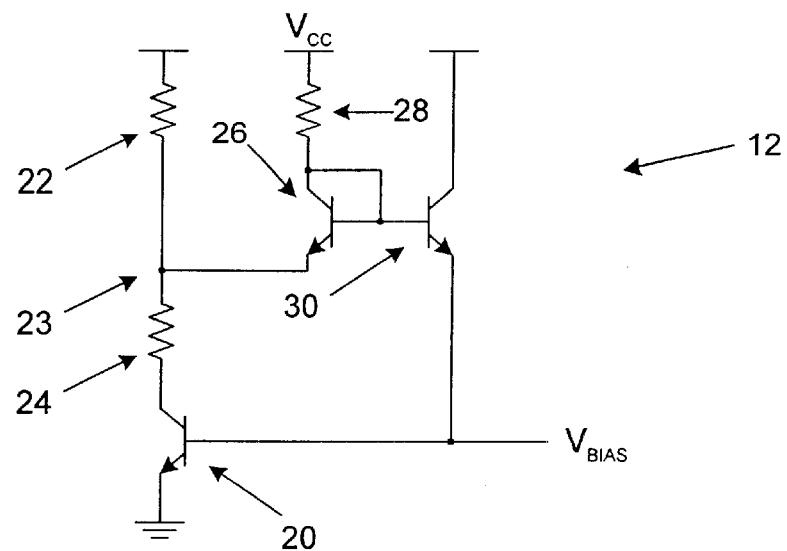
FIG. 3 is a schematic diagram of a bias voltage generating circuit for use in the amplifying circuits.
Figure 2:
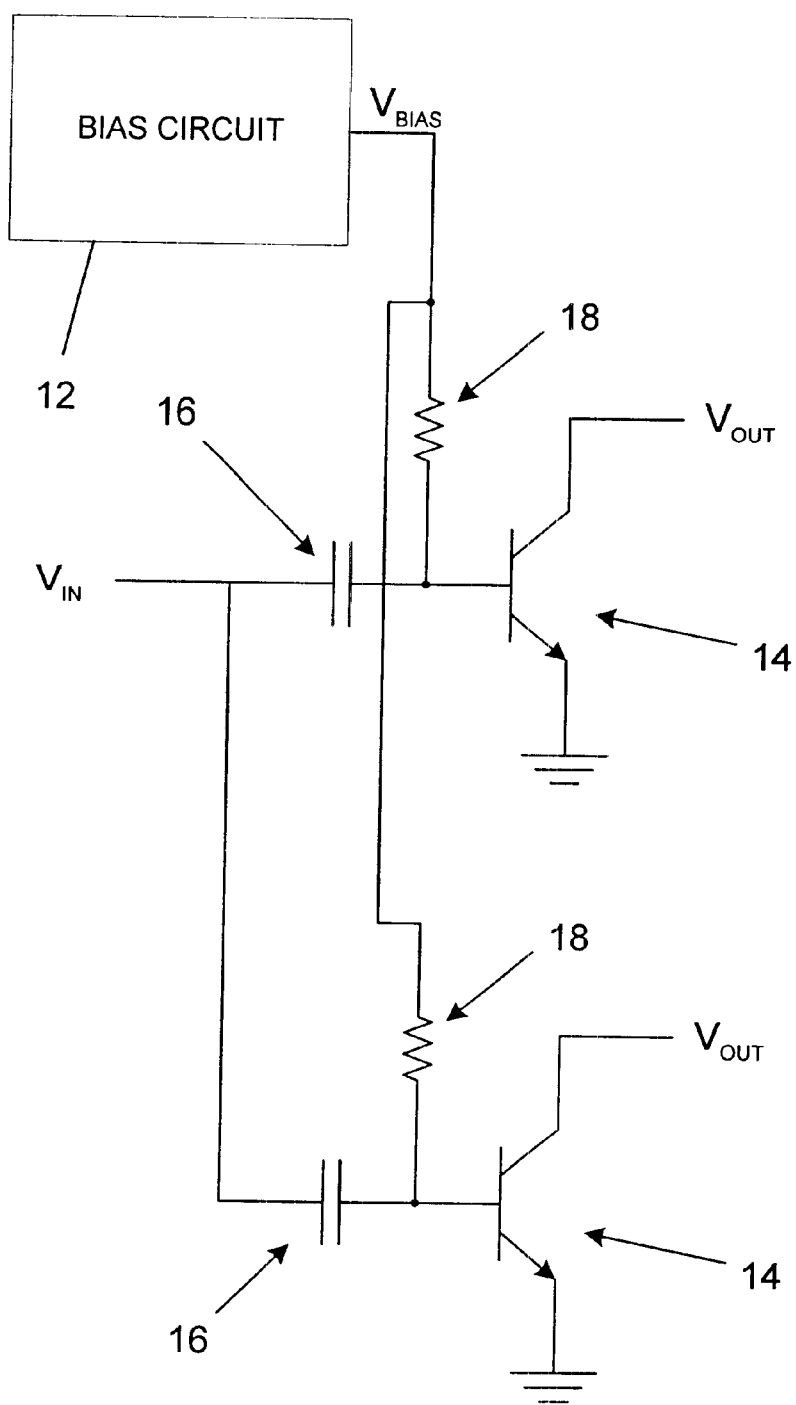
FIG. 2 is a schematic diagram in partial block form of another amplifying circuit designed in accordance with the present invention.

The preferred embodiments of the present invention and their advantages are best understood by referring to FIGS. 1, 2 and 3 of the drawings. Like numerals are used for like and corresponding parts of the various drawings.

Referring to FIG. 1, a schematic diagram in partial block form of an amplifying circuit 10 is shown. Amplifying circuit 10 may be used, for example, to provide power amplification of a radiofrequency (RF) signal $V_{IN}$. A bias voltage generating circuit 12 provides a bias voltage $V_{BIAS}$ to the base of an amplifying transistor 14 through a base ballast resistor 18. The RF input signal $V_{IN}$ is provided to the base of transistor 14 through a DC blocking capacitor 16. Transistor 14 has a grounded emitter. The output signal $V_{OUT}$ is provided at the collector of transistor 14.

For some power amplifier applications, a set of amplifier cells may be provided in parallel in a single amplifier stage, as shown in FIG. 2. Each amplifier cell includes an amplifying transistor 14 and a DC blocking capacitor 16. The input signal $V_{IN}$ and the bias voltage $V_{BIAS}$ are provided to each amplifier cell, and the output signal $V_{OUT}$ is provided by the collectors of transistors 14 in parallel. Base ballast resistors such as resistor 18 and/or emitter ballast resistors may be connected to each amplifying transistor 14 to provide thermal stabilization. Although only two amplifier cells are illustrated in FIG. 2, a much larger number of parallel amplifier cells may be used for an amplifier stage.

Referring to FIG. 3, a schematic diagram of bias voltage generating circuit 12 is shown. As described below, bias voltage generating circuit 12 is capable of generating a robust, stable bias voltage using a lower supply voltage than that previously used by bias circuits.

Bias voltage generating circuit 12 generates bias voltage $V_{BIAS}$ at the base of a bipolar transistor 20. Since transistor 20 has a grounded emitter, bias voltage $V_{BIAS}$ is approximately one threshold voltage above ground. If bias voltage $V_{BIAS}$ is supplied to the base of another grounded-emitter bipolar transistor of similar design, such as transistor(s) 14 shown in FIGS. 1 and 2, then the current density through both transistors (14 and 20) will be essentially the same. The two current densities differ only by the small voltage drop across base ballast resistor 18 due to the base current of transistor 14. This voltage drop only becomes significant when ballasting is needed (at high current levels). Thus, bias voltage generating circuit 12 may be used to set the centerpoint current density in an amplifying transistor such as transistor 14.

The collector of transistor 20 is connected to the supply voltage $V_{CC}$ through two resistors 22 and 24. The collector of a transistor 26 is connected to a node 23 between resistors 22 and 24. Transistor 26 is connected in a diode configuration in series with a resistor 28, which is connected to $V_{CC}$. Another transistor 30 has its base connected to the base of transistor 26 in an emitter follower configuration. Transistor 30 has its collector connected to $V_{CC}$ and its emitter connected to the base of transistor 20. Transistors 20, 26 and 30 may be, for example, heterojunction bipolar transistors (HBTs).

The operation of bias voltage generating circuit 12 is as follows. With no load connected to $V_{BIAS}$, bias voltage generating circuit 12 establishes a steady-state value of $V_{BIAS}$ at the threshold voltage of transistor 20 associated with the collector current flowing through resistors 22 and 24. When a load draws current from the base of transistor 20, a resulting voltage sag will decrease the current through transistor 20, thereby raising the voltage at node 23. Transistor 26 acts as a level shifter, providing a voltage to the base of transistor 30 that is one threshold voltage above the voltage at node 23. Thus, a voltage increase at node 23 is reflected in a voltage increase at the base of transistor 30. The increase in base voltage and the decrease in $V_{BIAS}$ cause transistor 30 to conduct more current, counteracting the voltage sag in $V_{BIAS}$.

This negative feedback loop provides a great deal of stability for $V_{BIAS}$. The responsiveness of the feedback loop is determined primarily by the values of resistors 22 and 24, the beta values of transistors 20 and 30 and the voltage difference between VCC and the collector of transistor 20. For maximum responsiveness, resistor 24 has a small resistance compared to that of resistor 22. In one embodiment, resistor 24 may be omitted entirely (R=0).

Bias voltage generating circuit 12 represents a significant improvement over a conventional bias circuit, such as one in which transistor 26 and resistor 28 are absent, and the base of transistor 30 is connected directly to node 23. Because $V_{BIAS}$ is approximately one threshold voltage above ground, the base of transistor 30 must be approximately two threshold voltages above ground. If the base of transistor 30 is directly connected to node 23, this means that node 23 must be approximately two threshold voltages above ground. This makes the current flowing through resistors 22 and 24 highly sensitive to the supply voltage $V_{CC}$ when $V_{CC}$ is close to two threshold voltages above ground. Under these supply conditions, a small change in supply voltage ($V_{CC}$) will result in a relatively large change in bias voltage.

For example, transistors 24 and 30 may be HBTs with a threshold voltage ($V_{BE}$) of approximately 1.25 volts. The supply voltage $V_{CC}$ may be, for example, 2.7 volts. In the conventional bias circuit described above, the voltage drop across resistors 22 and 24 is, at most, approximately 0.2 volts ($V_{CC}-2\times V_{BE}$). Thus, if the supply voltage $V_{CC}$ decreases by as little as 0.1 volt, the voltage drop across resistors 22 and 24 decreases by 50%. Since the voltage drop across resistors 22 and 24 is used to set the reference current level through transistor 20, a small change in supply voltage severely impacts the performance of this conventional bias circuit. Since power amplifiers used in portable applications such as cellular telephones receive their supply voltage from a source such as a rechargeable battery, better immunity to a supply voltage decrease is desired for longer effective battery life and better amplifier performance.

Bias voltage generating circuit 12 as shown in FIG. 3 is much less sensitive to supply voltage changes of the type previously described than the conventional bias circuit mentioned above. Bias voltage generating circuit 12 may operate with the collector of transistor 20 at approximately one threshold voltage above ground. Thus, for example, if $V_{BE}$= 1.25 volts and $V_{CC}$=2.7 volts, a decrease in $V_{CC}$ of 0.1 volts causes the voltage drop across resistors 22 and 24 to decrease from approximately 1.45 volts to 1.35 volts. This is a much smaller change (approximately 6.8%) than the 50% decrease described above for the conventional bias circuit under the same conditions. Since the voltage drop across resistors 22 and 24 is used to set the reference current level through transistor 20, bias voltage generating circuit 12 is less sensitive to supply voltage changes than conventional bias circuits.

Although the present invention and its advantages have been described in detail, it should be understood that various changes, substitutions, and alterations can be made therein without departing from the spirit and scope of the invention as defined by the appended claims.

I claim:

1. A bias voltage generating circuit operable to generate a bias voltage at an output node, the bias voltage generating circuit comprising:
    a first transistor having a base terminal coupled to the output node and an emitter terminal coupled to ground;
    a first resistance having a first terminal coupled to a supply voltage node, the first resistance having a second terminal coupled to a collector terminal of the first transistor;
    a second transistor having an emitter terminal coupled to the collector terminal of the first transistor, the second transistor having a base terminal connected to the collector terminal of the second transistor; and
    a second resistance having a first terminal coupled to the supply voltage node, the second resistance having a second terminal coupled to a collector terminal of the second transistor;
    a third transistor having a base terminal coupled to the base terminal of the second transistor, the third transistor having a collector terminal coupled to the supply voltage node, the third transistor having an emitter terminal coupled to the output node.

2. The bias voltage generating circuit of claim 1, wherein the first resistance comprises a first resistor, and wherein the bias voltage generating circuit further comprises a second resistor having a first terminal connected to the second terminal of the first resistor; the second resistor having a second terminal connected to the collector terminal of the first transistor.

3. The bias voltage generating circuit of claim 1, wherein the first, second and third transistors each comprise a heterojunction bipolar transistor.

4. The bias voltage generating circuit of claim 1, wherein the second resistance comprises a resistor.

5. An amplifier circuit comprising:
    an amplifying transistor having a base terminal coupled to an input signal source, an emitter terminal coupled to ground and a collector terminal coupled to an amplifier output node; and a bias voltage generating circuit having a bias output terminal coupled to the base terminal of the amplifying transistor, the bias voltage generating circuit being operable to generate a bias voltage at the base terminal of the amplifying transistor, the bias voltage generating circuit including:

a first transistor having a base terminal coupled to the bias output terminal and an emitter terminal coupled to ground;

a first resistor having a first terminal coupled to a supply voltage node, the first resistor having a second terminal coupled to a collector terminal of the first transistor;

a second transistor having an emitter terminal coupled to the collector terminal of the first transistor, the second transistor having a base terminal connected to the collector terminal of the second transistor; and a second resistor having a first terminal coupled to the supply voltage node, the second resistor having a second terminal coupled to a collector terminal of the second transistor;

a third transistor having a base terminal coupled to the base terminal of the second transistor, the third transistor having a collector terminal coupled to the supply voltage node, the third transistor having an emitter terminal coupled to the bias output terminal.

6. The amplifier circuit of claim 5, wherein the bias voltage generating circuit further comprises a third resistor having a first terminal coupled to the second terminal of the first resistor; the third resistor having a second terminal coupled to the collector terminal of the first transistor.

7. The amplifier circuit of claim 5, wherein the first, second and third transistors comprise heterojunction bipolar transistors.

8. The amplifier circuit of claim 5, wherein the amplifying transistor comprises a heterojunction bipolar transistor.

9. The amplifier circuit of claim 5, wherein the amplifying transistor comprises a first amplifying transistor, and wherein the amplifier circuit further comprises a second amplifying transistor having a base terminal coupled to the input signal source and to the bias output terminal, the second amplifying transistor further having an emitter terminal coupled to ground and a collector terminal coupled to the amplifier output node.

10. The amplifier circuit of claim 5, further comprising a capacitor having a first terminal coupled to the input signal source and a second terminal coupled to the base terminal of the amplifying transistor.

11. A method for amplifying an RF input signal, comprising:

providing a supply voltage to a first terminal of a first resistor, the first resistor having a second terminal coupled to a collector terminal of a first transistor;

providing the supply voltage to a first terminal of a second resistor, the second resistor having a second terminal connected to a collector terminal of a second transistor, the second transistor having an emitter terminal coupled to the collector terminal of the first transistor, the second transistor having a base terminal connected to the collector terminal of the second transistor;

providing the supply voltage to a collector terminal of a third transistor, the third transistor having a base terminal connected to the base terminal of the second transistor, the third transistor having an emitter terminal coupled to the base terminal of the first transistor;

generating a bias voltage by the third transistor at the emitter terminal of the third transistor;

supplying the bias voltage to a bias node coupled to a base terminal of an amplifying transistor;

supplying the RF input signal to an input node coupled to the base terminal of the amplifying transistor; and amplifying the RF input signal by the amplifying transistor.

12. The method of claim 11, further comprising supplying the bias voltage to a base terminal of a second amplifying transistor connected in parallel with the amplifying transistor;

supplying the RF input signal to the base terminal of the second amplifying transistor; and amplifying the RF input signal by the second amplifying transistor.

* * * * *